United States Patent
Toyoda

(10) Patent No.: US 7,379,160 B2
(45) Date of Patent: May 27, 2008

(54) OPTICAL INTEGRATOR, ILLUMINATION OPTICAL DEVICE, EXPOSURE APPARATUS, AND EXPOSURE METHOD

(75) Inventor: Mitsunori Toyoda, Sendai (JP)

(73) Assignee: Nikon Corporation, Tokyo (JP)

( * ) Notice: Subject to any disclaimer, the term of this patent is extended or adjusted under 35 U.S.C. 154(b) by 119 days.

(21) Appl. No.: 10/521,021

(22) PCT Filed: Jun. 17, 2003

(86) PCT No.: PCT/JP03/07691

§ 371 (c)(1),
(2), (4) Date: Feb. 1, 2005

(87) PCT Pub. No.: WO2004/008507

PCT Pub. Date: Jan. 22, 2004

(65) Prior Publication Data

US 2006/0109443 A1  May 25, 2006

(30) Foreign Application Priority Data

Jul. 12, 2002  (JP)  ............... 2002-204655

(51) Int. Cl.
*G03B 27/54* (2006.01)
*G03B 27/42* (2006.01)
*G03B 27/10* (2006.01)

(52) U.S. Cl. .................. 355/67; 355/53; 359/619; 359/621; 359/623; 359/624

(58) Field of Classification Search .................. 355/53, 355/67, 71, 77; 359/619, 620, 621, 622, 359/623, 624; 362/268
See application file for complete search history.

(56) References Cited

U.S. PATENT DOCUMENTS 6,285,440 B1  9/2001 Takahashi
6,323,937 B1  11/2001 Sano (Continued)

FOREIGN PATENT DOCUMENTS

DE  100 62 579 A1  6/2001

(Continued)

OTHER PUBLICATIONS

English translation of JP 2000-98102 cited above.*

(Continued)

*Primary Examiner*—Alan Mathews
(74) *Attorney, Agent, or Firm*—Oliff & Berridge, PLC

(57) ABSTRACT

An optical integrator having characteristics to reduce effects of manufacturing errors of many minute refraction surfaces integrally formed by, for example, etching on an illumination intensity distribution. An optical integrator (8) comprising an integrally formed plurality of first minute refraction surfaces (80a) and an integrally formed plurality of second minute refraction surfaces (80b). A parameter $\beta$ satisfies conditions, $|\beta|<0.2$ (where $\beta=(\gamma-1)^3 \cdot NA^2/\Delta n^2$), where a refracting power ratio $\phi a/\phi b$ between $\phi a$, a refracting power of the first minute refraction surfaces and $\phi b$, a refracting power of the second minute refraction surfaces is $\gamma$, numerical aperture on an emission side of the optical integrator is NA, and a difference between a refraction index of a medium on a light entrance side of the second minute refraction surfaces and a refraction index of a medium on a light emission side of the second minute refraction surfaces is $\Delta n$.

38 Claims, 8 Drawing Sheets

U.S. PATENT DOCUMENTS

| | | |
|---|---|---|
| 6,414,795 B1 | 7/2002 | Sugawara |
| 6,583,937 B1 | 6/2003 | Wangler et al. |
| 6,741,394 B1 * | 5/2004 | Tanitsu et al. ............. 359/619 |
| 6,757,106 B2 * | 6/2004 | Kusuyama .................. 359/619 |
| 2002/0126390 A1 * | 9/2002 | Matsushita et al. ......... 359/621 |

FOREIGN PATENT DOCUMENTS

| | | |
|---|---|---|
| EP | 0 668 541 A1 | 8/1995 |
| EP | 1 180 726 A2 | 2/2002 |
| EP | 1 211 561 A2 | 6/2002 |
| EP | 1 367 442 A2 | 12/2003 |
| JP | A 6-175028 | 6/1994 |
| JP | 07-098402 * | 4/1995 |
| JP | 2000-98102 * | 7/2000 |
| JP | A-2002-118043 | 4/2002 |
| WO | WO 01/61411 A1 | 8/2001 |

OTHER PUBLICATIONS

English translation of JP 07-098402 cited above.*
"Image Surface Illumination Intensity Distribution of Photographic Lens," Optical Technology Contact, vol. 5, No. 11, pp. 10-14, 1967 w/partial translation.
"Aberration Theory," Japan Optoelectro Mechanics Association, 1989 w/translation.

* cited by examiner

OPTICAL INTEGRATOR, ILLUMINATION OPTICAL DEVICE, EXPOSURE APPARATUS, AND EXPOSURE METHOD

TECHNICAL FIELD

The present invention relates to an optical integrator, an illumination optical device, an exposure apparatus, and an exposure method, and more particularly to an illumination optical device suitable for an exposure apparatus for manufacturing micro devices such as a semiconductor device, an image pickup device, a liquid crystal display device, and a thin film magnetic head in a lithography step.

BACKGROUND ART

In a typical exposure apparatus of this kind, a light beam emitted from a light source enters a fly's eye lens. Then, a secondary light source constructed from many light sources is formed on the rear side focal surface thereof. A light beam from the secondary light source is limited through an aperture stop arranged in the vicinity of the rear side focal surface of the fly's eye lens, and then, enters a condenser lens. The aperture stop limits a shape or a size of the secondary light source to a desired shape or a desired size according to desired illumination conditions (exposure conditions).

A light beam condensed by the condenser lens illuminates in a state of superimposition a mask in which a given pattern is formed. Light passing through the pattern of the mask forms an image on a wafer through a projection optical system. Thereby, the mask pattern is projected and exposed (transferred) on the wafer. The pattern formed on the mask is highly integrated. Therefore, in order to correctly transfer this fine pattern on the wafer, it is essential to obtain a uniform illumination intensity distribution on the wafer.

In the exposure apparatus having the foregoing construction, it is necessary to set minute lens elements constructing the fly's eye lens as much as possible in order to improve uniformity of the illumination intensity distribution. Further, it is necessary to form the secondary light source in the shape close to a desired shape in order to avoid light amount loss in the aperture stop. Therefore, for example, it is thinkable that a size of the minute lens element constructing the fly's eye lens is set very small, that is, a micro fly's eye lens is used.

The fly's eye lens is constructed by arranging many lens elements vertically and horizontally and densely. Meanwhile, the micro fly's eye lens is constructed by integrally forming many minute refraction surfaces. That is, the fly's eye lens is constructed by combining and densely arranging many single polished lens elements. Meanwhile, the micro fly's eye lens is constructed by forming many minute refraction surfaces on, for example, a parallel plane glass plate by applying MEMS technique (lithography plus etching and the like).

Therefore, the fly's eye lens can be manufactured by checking refraction surface shapes of polished lens elements, selecting lens elements meeting standards, and using only lens elements having a high-precisely formed refraction surface. However, in the micro fly's eye lens, all minute refraction surfaces are required to be concurrently manufactured by etching through which is hard to obtain a quality surface shape compared to polishing. Therefore, a straight pass ratio thereof becomes considerably lower than that of the fly's eye lens.

In view of the foregoing problem, it is an object of the invention to provide an optical integrator having characteristics to reduce the effects of manufacturing errors of many minute refraction surfaces integrally formed by etching or the like on an illumination intensity distribution. Further, it is another object of the invention to provide a highly efficient illumination optical device capable of illuminating an irradiated surface under desired illumination conditions by using the optical integrator, wherein the effects of the manufacturing errors of the minute refraction surfaces on the illumination intensity distribution are reduced. Further, it is still another object of the invention to provide an exposure apparatus and an exposure method capable of performing good projection exposure under good illumination conditions by using the highly efficient illumination optical device capable of illuminating the irradiated surface under the desired illumination conditions.

DISCLOSURE OF THE INVENTION

In order to solve the foregoing problem, a first invention of the present invention provides an optical integrator, comprising:

an integrally formed plurality of first minute refraction surfaces; and an integrally formed plurality of second minute refraction surfaces, which are provided closer to a light emission side than the plurality of first minute refraction surfaces so that the plurality of second minute refraction surfaces optically correspond to the plurality of first minute refraction surfaces, wherein a parameter $\beta$ satisfies the following conditions:

$|\beta|<0.2$ (where $\beta=(\gamma-1)^3 \cdot NA^2/\Delta n^2$), where a refracting power ratio $\phi a/\phi b$ between $\phi a$, a refracting power of the first minute refraction surfaces and $\phi b$, a refracting power of the second minute refraction surfaces is $\gamma$, numerical aperture on the emission side of the optical integrator is NA, and a difference between a refraction index of a medium on a light entrance side of the second minute refraction surfaces and a refraction index of the medium on a light emission side of the second minute refraction surfaces is $\Delta n$.

According to a preferable aspect of the first invention, the plurality of first minute refraction surfaces and the plurality of second minute refraction surfaces are formed on the same optical member. Otherwise, the optical integrator comprises: a first optical member having the plurality of first minute refraction surfaces; and a second optical member having the plurality of second minute refraction surfaces arranged on a light emission side of the first optical member. Further, according to the preferable aspect of the first invention, the plurality of second minute refraction surfaces comprise aspherical surfaces.

A second invention of the present invention provides an optical integrator, comprising in the order from a light entrance side:

a first optical member having an integrally formed plurality of first minute refraction surfaces; and a second optical member having an integrally formed plurality of second minute refraction surfaces, which are provided to optically correspond to the plurality of first minute refraction surfaces, wherein a refraction index of an optical material forming the second optical member is set larger than a refraction index of an optical material forming the first optical member.

According to a preferable aspect of the second invention, the optical integrator satisfies a condition, $0.05 \leq nb-na$, where the refraction index of the optical material forming the first optical member is na, and the refraction index of the optical material forming the second optical member is nb. Further, it is preferable that the optical integrator is used for light having a wavelength of 300 nm or less, and the optical material forming the first optical member includes silica glass or fluorite, and the optical material forming the second optical member includes one material of magnesium oxide, ruby, sapphire, quartz crystal, and silica glass. Otherwise, it is preferable that the optical integrator is used for light having a wavelength of 300 nm or less, and the optical material forming the first optical member includes fluorite, and the optical material forming the second optical member includes silica glass. Further, in the first invention and the second invention, it is preferable that each minute refraction surface is formed spherically or aspherically. Further, it is preferable that this aspherical surface is a rotational symmetry aspherical surface or a rotational asymmetry aspherical surface (for example, a cylindrical surface).

A third invention of the present invention provides an illumination optical device for illuminating an irradiated surface, comprising: the optical integrator of the first invention or the second invention. In this case, it is preferable that the optical integrator forms a light intensity distribution in a given shape in an illumination region.

A fourth invention of the present invention provides an exposure apparatus, comprising: the illumination optical device of the third invention; and a projection optical system for projecting and exposing a pattern of a mask arranged on the irradiated surface on a photosensitive substrate.

According to a preferable aspect of the fourth invention, the pattern of the mask is projected and exposed on the photosensitive substrate by relatively moving the mask and the photosensitive substrate in relation to the projection optical system along a scanning direction, and an absolute value of the parameter $\beta$ in terms of a direction optically approximately perpendicular to the scanning direction is set lower than an absolute value of the parameter $\beta$ in terms of the scanning direction.

A fifth invention of the present invention provides an exposure method, wherein a mask is illuminated through the illumination optical device of the third invention, and wherein an image of a pattern formed on the illuminated mask is projected and exposed on a photosensitive substrate.

A sixth invention of the present invention provides an exposure apparatus, comprising:

an illumination optical system including an optical integrator; and a projection optical system for forming a pattern image of a mask on a photosensitive substrate, wherein the pattern of the mask is projected and exposed on the photosensitive substrate while the mask and the photosensitive substrate are relatively moved in relation to the projection optical system along a scanning direction, wherein the optical integrator comprises: an integrally formed plurality of first minute refraction surfaces; and an integrally formed plurality of second minute refraction surfaces, which are provided closer to a light emission side than the plurality of first minute refraction surfaces so that the plurality of second minute refraction surfaces optically correspond to the plurality of first minute refraction surfaces, and wherein a parameter $\beta$ satisfies the following conditions:

$|\beta|<0.2$ (where $\beta=(\gamma-1)^3 \cdot NA^2/\Delta n^2$), where a refracting power ratio $\phi a/\phi b$ between $\phi a$, a refracting power of the first minute refraction surfaces in terms of a nonscanning direction optically approximately perpendicular to the scanning direction and $\phi b$, a refracting power of the second minute refraction surfaces in terms of the nonscanning direction is $\gamma$, numerical aperture on the emission side in terms of the nonscanning direction of the optical integrator is NA, and a difference between a refraction index of a medium on a light entrance side of the second minute refraction surfaces and a refraction index of the medium on a light emission side of the second minute refraction surfaces is $\Delta n$.

BEST MODE FOR CARRYING OUT THE INVENTION

Figure 1:
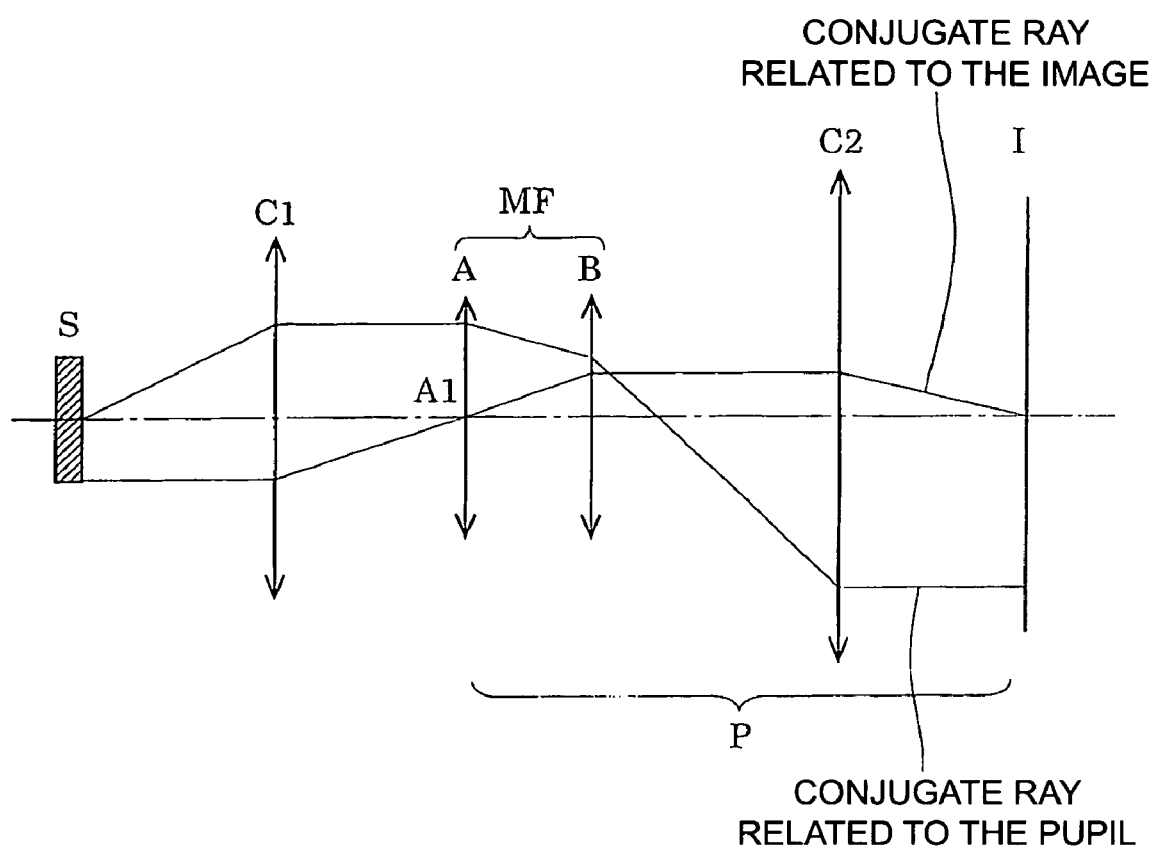
FIG. 1 is a view explaining a basal principle of the invention.

FIG. 1 is a view explaining a basal principle of the invention. Referring to FIG. 1, light supplied from a light source S provides Koehler illumination for a micro fly's eye lens MF through a first condenser optical system C1. The micro fly's eye lens MF comprises a first subsystem A and a second subsystem B in the order from the light source S side. Many first minute refraction surfaces are integrally formed in the first subsystem A, and many second minute refraction surfaces are integrally formed in the second subsystem B so that the second minute refraction surfaces optically correspond to the first minute refraction surfaces.

Therefore, light whose wavefront is segmented by the respective minute refraction surfaces of the micro fly's eye lens MF reaches an illumination field I on an irradiated surface through a second condenser optical system C2. Here, an optical conjugate relation is established between an entrance surface A1 of the micro fly's eye lens MF (that is, an entrance surface of the first subsystem A) and the illumination field I. Therefore, a light intensity distribution in a region corresponding to each minute refraction surface on the entrance surface A1 is respectively expanded and projected on the whole illumination field I. FIG. 1 shows a model of only light ray corresponding to one minute refraction surface. However, in practice, the whole illumination field I is illuminated in a state of superimposition through many minute refraction surfaces, and thereby uniformity of illumination intensity can be obtained over the whole illumination field I.

In the illumination system shown in FIG. 1, there is the conjugate relation between the entrance surface A1 of the micro fly's eye lens MF and the illumination field I. However, when a distortion aberration of an imaging system P (micro fly's eye lens MF plus second condenser optical system C2) is changed, an imaging magnification varies according to an image height. Therefore, the illumination intensity distribution in the illumination field I becomes changed. For example, according to Isshiki Masaki, "Image Surface Illumination Intensity Distribution of Photographic Lens", Optical Technology Contact Vol. 5, No. 11, pp. 10-14, 1967, it is known that when the distortion aberration of the imaging system P is changed by D %, the illumination intensity in the illumination field (image surface of the imaging system P) I is changed by about 4D %.

As an evaluation method for the aberration of the imaging system (including the distortion aberration), aberration evaluation method by third order aberration theory is known. Analysis of the aberration by the third order aberration theory has an advantage that evaluation is facilitated since analytical calculation is enabled in spite of errors due to approximation. Details of derivation method of an aberration coefficient by the third order aberration theory are, for example, described in Matsui Yoshiya, "Aberration Theory," Japan Optoelectro Mechanics Association, 1989. Discussion will be hereinafter given of change of the distortion aberration of the imaging system P lying between the entrance surface A1 of the micro fly's eye lens MF and the illumination field I when surface shapes of the minute refraction surfaces of the micro fly's eye lens MF are changed by using the third order aberration theory.

A surface shape of each minute refraction surface in the micro fly's eye lens MF is expressed by the following Formula (1), where a height in the direction perpendicular to an optical axis is y, a distance (sag amount) along the optical axis between a tangent plane on the top of the refraction surface and a position on the refraction surface in the height y is x, a curvature is c, and a conic coefficient is κ.

$$x = (c \cdot y^2)/[1 + \{1-(\kappa+1)c^2 \cdot y^2\}^{1/2}] \quad (1)$$

According to the third order aberration theory, any aberration coefficient can be expressed by a sum of a spheric term and an aspheric term. Variations of surface shapes in manufacturing the micro fly's eye lens MF appear as change of the curvature c and the conic coefficient κ in the foregoing formula (1). Here, the change of the curvature c affects a size of illumination, but does not affect illumination nonuniformity practically. Meanwhile, the change of the conic coefficient κ changes the aspheric term of the aberration coefficient, and affects the illumination nonuniformity.

According to the foregoing Matsui Yoshiya, "Aberration Theory", $V_{asp}$, an aspheric term of the distortion aberration coefficient of object imaging is generally expressed by the following Formula (2). In Formula (2), $h_i$ represents a light ray height of an image paraxial tracing value (light ray height in tracing an object (image) paraxial ray (paraxial ray related to the object (the image))), and $h_p$ represents a light ray height of a pupil paraxial tracing value (light ray height in tracing a pupil paraxial ray (paraxial ray related to the pupil)). Ψ represents a coefficient expressed by the next Formula (3).

$$V_{asp} = h_i \cdot h_p^3 \cdot \Psi \quad (2)$$

$$\Psi = \Delta n \cdot c^3 \cdot \kappa \quad (3)$$

Figure 2:
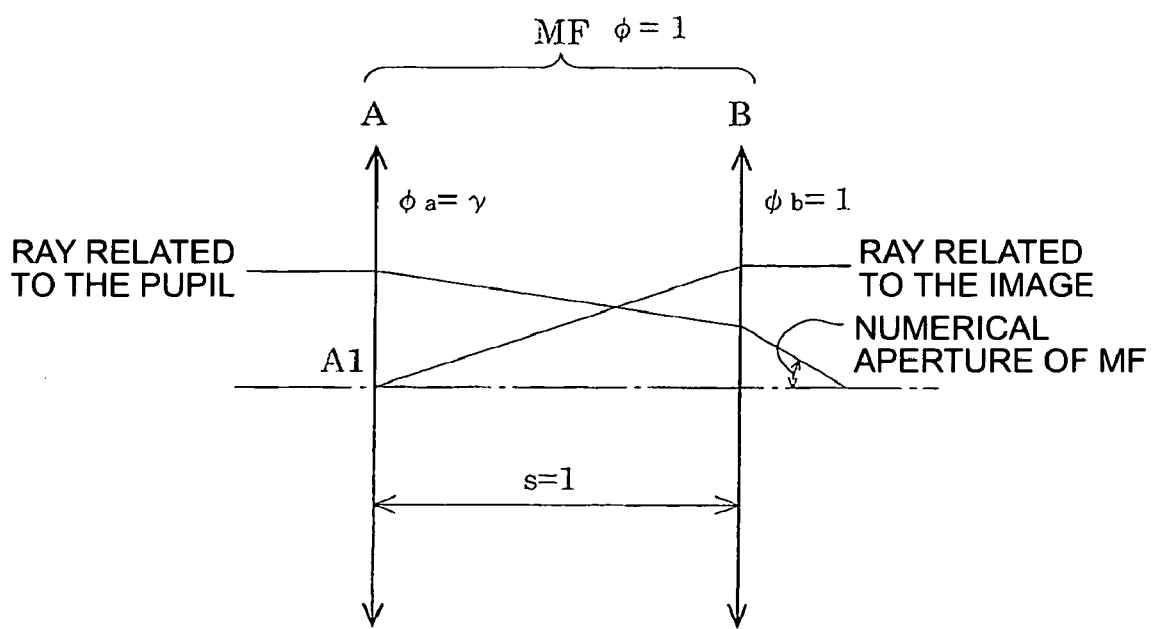
FIG. 2 is a view explaining optical characteristics in a micro fly's eye lens of FIG. 1.

Here, Δn represents a difference between a refraction index of a medium on the light entrance side of the minute refraction surfaces and a refraction index of a medium on the light emission side of the minute refraction surfaces. Δn represents a value obtained by subtracting n1, a refraction index of the medium on the light entrance side of the minute refraction surfaces from n2, a refraction index of the medium on the light emission side of the minute refraction surfaces (n2−n1). FIG. 2 is a view explaining optical characteristics in the micro fly's eye lens of FIG. 1. In FIG. 2, a refracting power (power) of the micro fly's eye lens MF is expressed by φ, a refracting power of the first subsystem A is expressed by φa, a refracting power of the second subsystem B is expressed by φb, and an air conversion surface-to-surface distance between the first subsystem A and the second subsystem B is expressed by s.

Therefore, relations shown in the following Formulas (4a) to (4d) are established, where φ, the refracting power of the micro fly's eye lens MF is standardized to 1, and a refracting power ratio φa/φb between φa, the refracting power of the first subsystem A and φb, the refracting power of the second subsystem B is γ.

$$\phi = 1 \quad (4a)$$

$$\phi a = \gamma \quad (4b)$$

$$\phi b = 1 \quad (4c)$$

$$s = 1 \quad (4d)$$

Paraxial tracing values then are shown in the following Table 1.

TABLE 1

| | Height of ray related to the image $h_i$ | Image conversion obliquity $\alpha_i$ | Height of ray related to the pupil $h_p$ | Pupil conversion obliquity $\alpha_p$ |
|---|---|---|---|---|
| First subsystem A | 0 | −1 | −1 | 0 |
| Second subsystem B | 1 | −1 | γ − 1 | −γ |

Referring to Table 1 and Formulas (2) and (3), $V_{aspA}$, an aspheric term of the distortion aberration coefficient in the first subsystem A and $V_{aspB}$, an aspheric term of the distortion aberration coefficient in the second subsystem B are expressed by the following Formulas (5) and (6) respectively.

$$V_{aspA} = 0 \quad (5)$$

$$V_{aspB} = (\gamma-1)^3 \cdot \Delta n \cdot c^3 \cdot \kappa \quad (6)$$

Referring to Formulas (5) and (6), it is found that change of the aspheric term of the distortion aberration coefficient caused by variations of surface shapes of the minute refraction surfaces of the micro fly's eye lens MF (that is, change of the conic coefficient κ) is generated only in the second subsystem B in the range of the third order aberration. Next, discussions will be given of effects of the change of the aspheric term of the distortion aberration coefficient on the illumination intensity distribution in the illumination field I. In the second subsystem B, the proportionality relation shown in the following Formula (7) is established between the curvature c and the refraction index difference Δn.

$$c \propto 1/\Delta n \quad (7)$$

In the range of the third order aberration, the illumination intensity distribution in the illumination field I is changed in proportion to a square value of the image height. The image height is proportional to numerical aperture NA on the emission side of the micro fly's eye lens MF. Therefore, based on Formulas (5) to (7), change of the distortion aberration caused by change of surface shapes of the minute refraction surfaces of the micro fly's eye lens MF, then β, sensitivity of change of the illumination intensity distribution on the illumination field (image surface) I is expressed by the following Formula (8).

$$\beta = (\gamma-1)^3 \cdot NA^2 / \Delta n^2 \quad (8)$$

When the micro fly's eye lens MF is arranged in the air, Formula (8) can be transformed into the following Formula (8'), where a refraction index of an optical material forming the second subsystem B is n.

$$\beta = (\gamma-1)^3 \cdot NA^2 / (n-1)^2 \quad (8')$$

Thereby, it is possible to reduce change of the distortion aberration caused by variations of surface shapes of the minute refraction surfaces of the micro fly's eye lens MF, and to reduce effects on the illumination intensity distribution in the illumination field I by reducing an absolute value of the parameter β. In other words, it is possible to realize a micro fly's eye lens (optical integrator) MF having characteristics, wherein effects of manufacturing errors of many minute refraction surfaces integrally formed by etching or the like on the illumination intensity distribution are reduced by reducing the absolute value of the parameter β.

Referring to Formula (8), it is thinkable that the absolute value of the parameter β can be reduced by increasing the refracting power ratio γ, increasing the refraction index difference Δn, and reducing the numerical aperture NA on the emission side of the micro fly's eye lens MF. However, when the refracting power ratio γ is increased and gets close to 1, the risk that an energy density on an entrance surface B2 of the micro fly's eye lens MF (that is, emission surface of the second subsystem B) is increased and then the second subsystem B is damaged by light energy irradiation becomes increased.

Further, the numerical aperture NA on the emission side of the micro fly's eye lens MF is determined by a size of an illumination region and a focal length of the second condenser optical system C2. In general, there is no design flexibility to set the numerical aperture NA on the emission side of the micro fly's eye lens MF to a desired small value without changing the size of the illumination region and the focal length of the second condenser optical system C2. In result, in the invention, such a technique is adapted that the refraction index difference Δn in the second subsystem B is set large. However, the cost is easily increased along with increase of the refraction index of the optical material. Therefore, it is realistic that an optical material having a high refraction index is used only for the second subsystem B.

Therefore, in the invention, nb, a refraction index of an optical material forming the second subsystem B (second optical member) is set larger than na, a refraction index of an optical material forming the first subsystem A (first optical member). In this case, in order to well demonstrate effects of the invention, it is preferable that the refraction index na and the refraction index nb satisfy a condition of 0.05≦nb−na. More specifically, when the first subsystem A is formed by silica glass or fluorite, it is preferable that the second subsystem B is formed by magnesium oxide, ruby, sapphire, quartz crystal, or silica glass. When the first subsystem A is formed by fluorite, it is preferable that the second subsystem B is formed by silica glass.

According to a simulation based on a design numerical value example, in the case of a typical micro fly's eye lens MF, wherein a size (dimension) of each minute refraction surface is 0.7 mm and numerical aperture NA on the emission side is 0.25, it was found that it was difficult to obtain a surface shape error of the minute refraction surfaces of 50 nm or less, and in this case, when the absolute value of the parameter β was larger than 0.2, variations of illumination intensity in the illumination field (image surface) I tended to become large as much as intolerable.

Therefore, in the invention, change of the distortion aberration caused by variations of surface shapes of the minute refraction surfaces of the micro fly's eye lens MF is reduced, and then effects on the illumination intensity distribution in the illumination field I are reduced by setting the absolute value of the parameter β lower than 0.2. In order to further reduce effects of the manufacturing error of the minute refraction surfaces on the illumination intensity distribution, it is preferable that the upper limit value of the absolute value of the parameter β is set to 0.13. In some cases, it is necessary to highly control the illumination intensity distribution in the illumination region in the illumination system. In this case, it is preferable that the absolute value of the parameter β is set lower than 0.2, and the minute refraction surfaces of the second subsystem B are aspheric. Thereby, it becomes possible to control the distortion aberration of the imaging system P (micro fly's eye lens MF plus second condenser optical system C2). Then, it becomes possible to approximate the illumination intensity distribution in the illumination region to a desired distribution.

An embodiment of the invention will be described with reference to the attached drawings.

Figure 3:
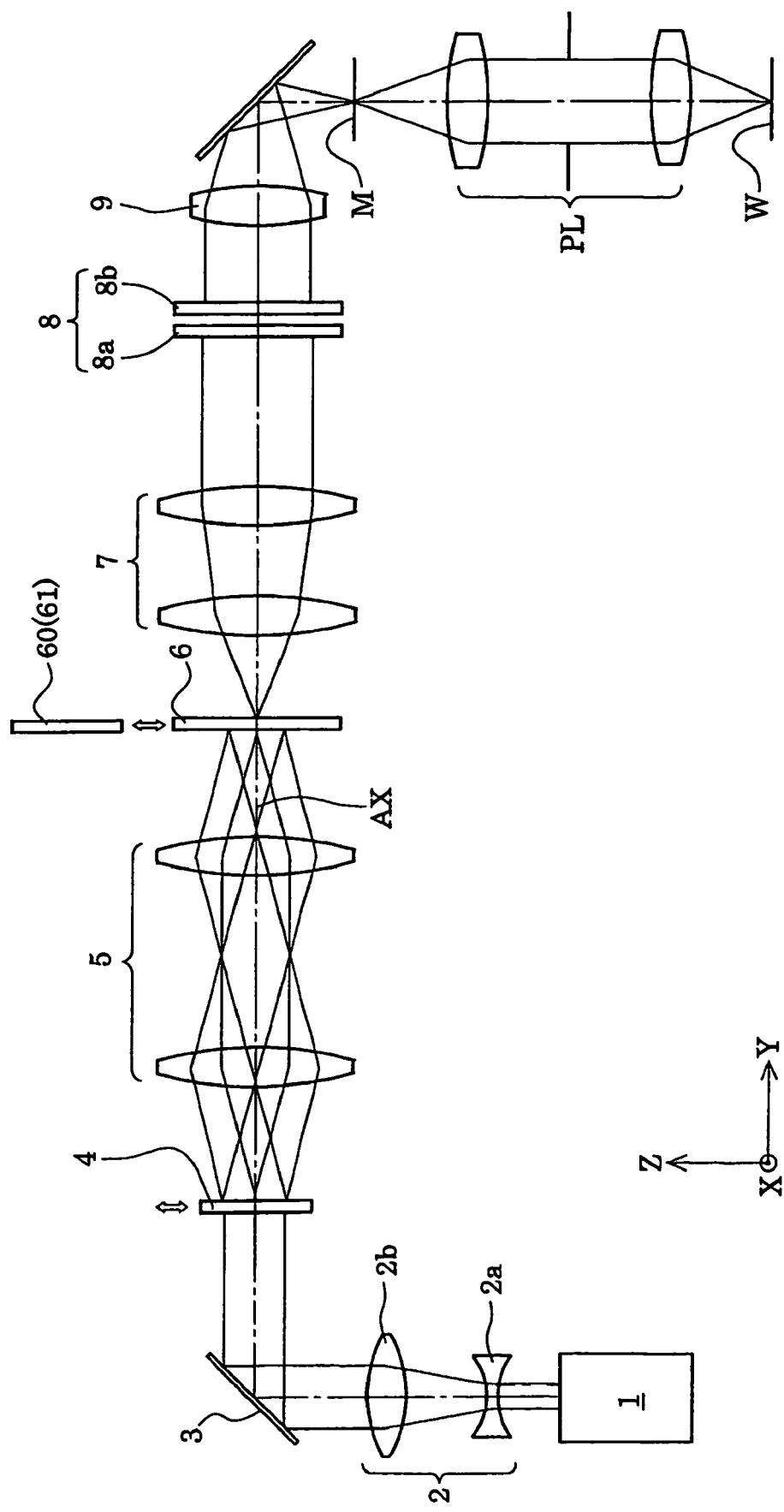
FIG. 3 is a view schematically showing a construction of an exposure apparatus comprising an illumination optical device according to an embodiment of the invention.

FIG. 3 is a view schematically showing a construction of an exposure apparatus comprising an illumination optical device according to the embodiment of the invention. In FIG. 3, Z axis is set along the normal line of a wafer W, a photosensitive substrate, Y axis is set in the direction parallel to a paper space of FIG. 3 in a wafer face, and X axis is set in the direction perpendicular to the paper space of FIG. 3 in the wafer face respectively. In FIG. 3, the illumination optical device is set to perform annular illumination.

The exposure apparatus of FIG. 3 comprises, for example, a KrF excimer laser light source for supplying light having a wavelength of 248 nm, or an ArF excimer laser light source for supplying light having a wavelength of 193 nm as a light source 1. An almost parallel light beam emitted from the light source 1 along the Z direction has a rectangular cross section longly extending along the X direction. The light beam enters a beam expander 2 constructed from a pair of lenses 2a and 2b. The respective lenses 2a and 2b have a negative refracting power and a positive refracting power in the paper space (YZ plain) of FIG. 3 respectively. Therefore, the light beam entering the beam expander 2 is expanded in the paper space of FIG. 3, and shaped into a light beam having a given rectangular cross section.

An almost parallel light beam through the beam expander 2 as a optical shaping system is deflected in the Y direction by a deflecting mirror 3, and then enters an afocal zoom lens 5 through a diffractive optical element 4. In general, the diffractive optical element is constructed by forming steps having a pitch of about a wavelength of exposure light (illumination light) on a glass substrate. The diffractive optical element has an action for diffracting an incident beam at a desired angle. More specifically, when a parallel light beam having a rectangular cross section enters the diffractive optical element 4, the diffractive optical element 4 has a function to form a circular light intensity distribution in a far field thereof (or Fraunhofer diffraction region).

Therefore, the light beam through the diffractive optical element 4 forms the circular light intensity distribution, that is, a light beam having a circular cross section in the position of a pupil of the afocal zoom lens 5.

The diffractive optical element 4 is constructed to be able to retreat from an illumination optical path. The afocal zoom lens 5 is constructed to be able to continuously change magnifications in a given range while maintaining an afocal system (afocal optical system). A light beam through the afocal zoom lens 5 enters a diffractive optical element 6 for annular illumination. The afocal zoom lens 5 optically and almost conjugately connects a divergence original point of the diffractive optical element 4 and a diffractive surface of the diffractive optical element 6. Numerical aperture of the light beam focusing on one point of the diffractive surface of the diffractive optical element 6 or the surface in the vicinity thereof varies according to magnifications of the afocal zoom lens 5.

When a parallel light beam enters the diffractive optical element 6 for annular illumination, the diffractive optical element 6 for annular illumination has a function to form a ring light intensity distribution in a far field thereof. The diffractive optical element 6 is constructed removably from the illumination optical path. In addition, the diffractive optical element 6 is constructed changeably with a diffractive optical element 60 for quadrupole illumination or a diffractive optical element 61 for circular illumination. A light beam through the diffractive optical element 6 enters a zoom lens 7. In the vicinity of a rear side focal surface of the zoom lens 7, an entrance surface of a micro fly's eye lens 8 constructed from a first fly's eye member 8a and a second fly's eye member 8b in the order from the light source side (that is, entrance surface of the first fly's eye member 8a) is positioned. The micro fly's eye lens 8 functions as an optical integrator forming many light sources based on the incident light beam. Its detailed construction and action will be described later.

As described above, the light beam from the circular light intensity distribution formed in the position of the pupil of the afocal zoom lens 5 through the diffractive optical element 4 is emitted from the afocal zoom lens 5. After that, the emitted light beam becomes a light beam having various angle elements, which enters the diffractive optical element 6. Therefore, the light beam through the diffractive optical element 6 forms, for example, an annular illumination field centering on an optical axis AX on the rear side focal surface of the zoom lens 7 (then on the entrance surface of the micro fly's eye lens 8).

An outer diameter of the annular illumination field formed on the entrance surface of the micro fly's eye lens 8 varies according to focal lengths of the zoom lens 7. Therefore, the zoom lens 7 practically connects the diffractive optical element 6 and the entrance surface of the micro fly's eye lens 8 in a state of Fourier transformation relation. A light beam entering the micro fly's eye lens 8 is segmentalized two-dimensionally. Many light sources (hereinafter referred to as "secondary light source") in the same annular state as in the illumination field formed by the incident light beam are formed on the rear side focal surface thereof.

A light beam from the annular secondary light source formed on the rear side focal surface of the micro fly's eye lens 8 receives a condensing action of a condenser optical system 9, and then illuminates in a state of superimposition a mask M, wherein a given pattern is formed. A light beam passing through the mask M forms an image of the mask pattern on the wafer W, the photosensitive substrate through a projection optical system PL. Thereby, the pattern of the mask M is sequentially exposed in each exposure region of the wafer W by performing exposure in batch or scanning exposure while two-dimensionally drive-controlling the wafer W in the plane (XY plane) perpendicular to the optical axis AX of the projection optical system PL.

In the exposure in batch, the mask pattern is exposed in batch for each exposure region of the wafer according to so-called step and repeat method. In this case, a shape of the illumination region on the mask M is a rectangle close to a square. Meanwhile, in the scanning exposure, the mask pattern is scanned and exposed for each exposure region of the wafer while the mask and the wafer are relatively moved in relation to the projection optical system according to so-called step and scanning method. In this case, a shape of the illumination region on the mask M is a rectangle, wherein a ratio between a short side and a long side is, for example, 1:3.

In this embodiment, when a magnification of the afocal zoom lens 5 is changed, a center height of the annular secondary light source (distance between a center line of the circle and the optical axis AX) is not changed, but only a width thereof (½ of a difference between an outer diameter (diameter) and an internal diameter (diameter)) is changed. That is, it is possible to change both a size (outer diameter) and a shape (annular ratio: internal diameter/outer diameter) of the annular secondary light source by changing magnifications of the afocal zoom lens 5.

Further, when the focal length of the zoom lens 7 is changed, the annular ratio of the annular secondary light source is not changed, but both the center height and the width thereof are changed. That is, it is possible to change an outer diameter of the annular secondary light source without changing the annular ratio thereof by changing the focal length of the zoom lens 7. Therefore, in this embodiment, only the annular ratio of the annular secondary light source can be changed without changing the outer diameter thereof by changing magnifications of the afocal zoom lens 5 and focal lengths of the zoom lens 7 as appropriate.

As described above, the diffractive optical element 6 is constructed removably from the illumination optical path. In addition, the diffractive optical element 6 is constructed changeably with the diffractive optical element 60 for quadrupole illumination or the diffractive optical element 61 for circular illumination. Description will be hereinafter given of the quadrupole illumination obtained by setting the diffractive optical element 60 in the illumination optical path instead of the diffractive optical element 6. When a parallel light beam enters the diffractive optical element 60 for quadrupole illumination, the diffractive optical element 60 for quadrupole illumination has a function to form a four point light intensity distribution in a far field thereof. Therefore, a light beam through the diffractive optical element 60 forms a quadrupole illumination field constructed from four circular illumination fields centering on, for example, the optical axis AX on the entrance surface of the micro fly's eye lens 8. In result, the same quadrupole secondary light source as in the illumination field formed on the entrance surface of the micro fly's eye lens 8 is formed on the rear side focal surface of the micro fly's eye lens 8.

As in the case of the annular illumination, it is also possible in the quadrupole illumination that both an outer diameter of the quadrupole secondary light source (diameter of a circumscribed circle of four circular surface light sources) and an annular ratio thereof (diameter of an inscribed circle of the four circular surface light sources/diameter of the circumscribed circle of the four circular surface light sources) are changed by changing magnifications of the afocal zoom lens 5. Further, it is possible to change the outer diameter of the quadrupole secondary light source without changing the annular ratio thereof by changing the focal length of the zoom lens 7. In result, only the annular ratio of the quadrupole secondary light source can be changed without changing the outer diameter of the quadrupole secondary light source by changing magnifications of the afocal zoom lens 5 and focal lengths of the zoom lens 7 as appropriate.

Next, descriptions will be given of the circular illumination obtained by retiring the diffractive optical element 4 from the illumination optical path and setting the diffractive optical element 61 for circular illumination in the illumination optical path instead of the diffractive optical elements 6 or 60. In this case, a light beam having a rectangular cross section enters the afocal zoom lens 5 along the optical axis AX. The light beam entering the afocal zoom lens 5 is expanded or reduced according to the magnification, is emitted from the afocal zoom lens 5 along the optical axis AX while being the light beam having the rectangular cross section as it is, and enters the diffractive optical element 61.

Here, similarly to the diffractive optical element 4, when a parallel light beam having a rectangular cross section enters the diffractive optical element 61 for circular illumination, the diffractive optical element 61 for circular illumination has a function to form a circular light intensity distribution in a far field thereof. Therefore, the circular light beam formed by the diffractive optical element 61 forms a circular illumination field centering on the optical axis AX on the entrance surface of the micro fly's eye lens 8 through the zoom lens 7. In result, a circular secondary light source centering on the optical axis AX is formed on the rear side focal surface of the micro fly's eye lens 8 as well. In this case, an outer diameter of the circular secondary light source can be changed as appropriate by changing magnifications of the afocal zoom lens 5 or focal lengths of the zoom lens 7.

Figure 4:
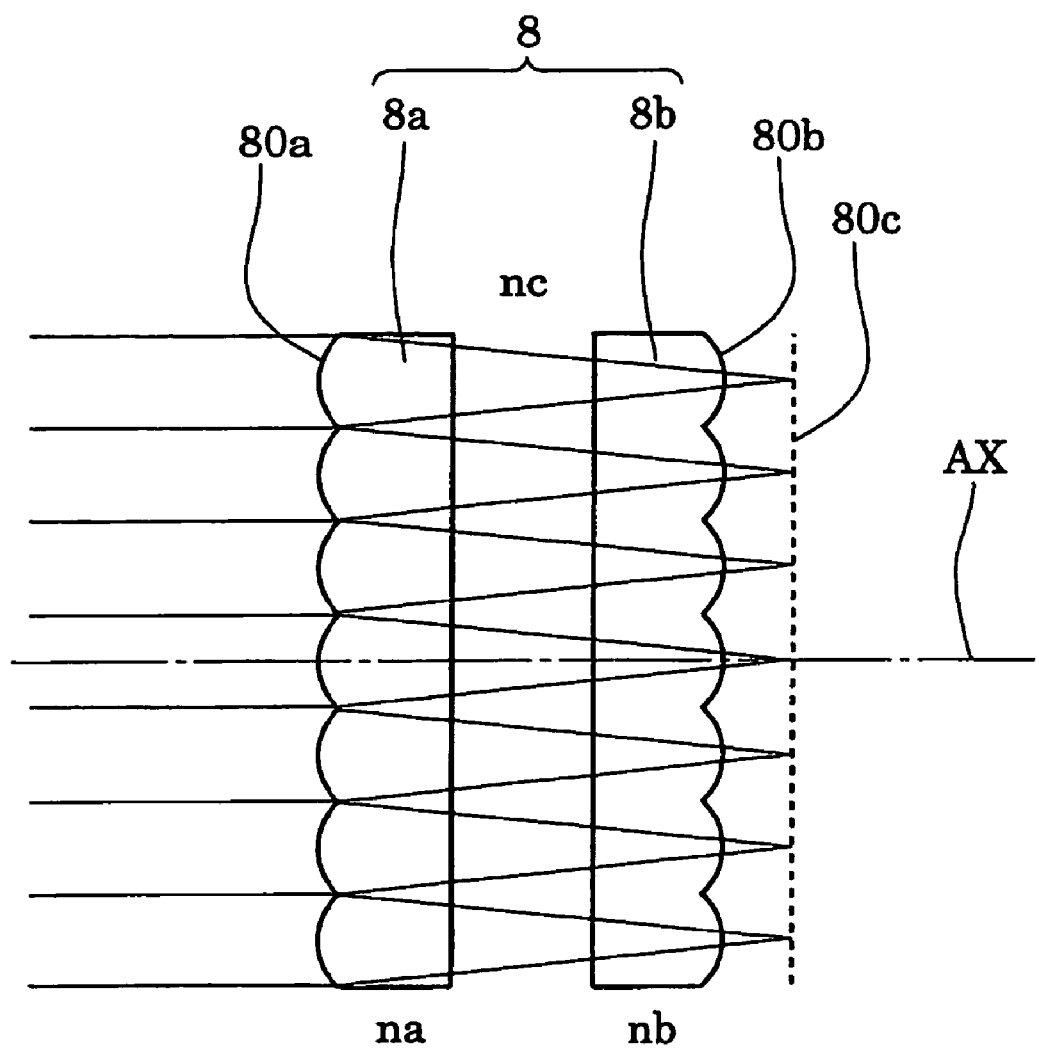
FIG. 4 is a view schematically showing a construction of a micro fly's eye lens of FIG. 3.

FIG. 4 is a view schematically showing a construction of the micro fly's eye lens of FIG. 3. Referring to FIG. 4, the micro fly's eye lens 8 is constructed from the first fly's eye member 8a arranged on the light source side and the second fly's eye member 8b arranged on the mask side (irradiated surface side). Many first minute refraction surfaces 80a are vertically and horizontally and integrally formed on a surface on the light source side (left of center in FIG. 4) of the first fly's eye member 8a. Meanwhile, many second minute refraction surfaces 80b are vertically and horizontally and integrally formed on a surface on the mask side of the second fly's eye member 8b so that the second minute refraction surfaces 80b optically correspond to many first minute refraction surfaces 80a.

Here, each minute refraction surface is formed spherically, and has a rectangular outer shape similar to the illumination region to be formed on the mask M. Therefore, a wavefront of a parallel light beam entering the micro fly's eye lens 8 is segmentalized by many first minute refraction surfaces 80a. Then, the parallel light beam sequentially receives refraction actions of the first minute refraction surfaces 80a and the corresponding second minute refraction surfaces 80b. After that, the light beam focuses on a rear side focal surface 80c of the micro fly's eye lens 8. In result, many light sources as many as the number of the first minute refraction surfaces 80a (then the number of the second minute refraction surfaces 80b) are formed.

In this embodiment, the first fly's eye member 8a is formed, for example, by silica glass or fluorite, and the second fly's eye member 8b is formed, for example, by quartz crystal. Otherwise, the first fly's eye member 8a is formed, for example, by fluorite, and the second fly's eye member 8b is formed, for example, by silica glass. That is, nb, the refraction index of the optical material forming the second fly's eye member 8b is set larger than na, the refraction index of the optical material forming the first fly's eye member 8a by, for example, 0.05 or more.

Further, in this embodiment, the absolute value of the parameter $\beta$ defined by Formula (8) is set lower than 0.2. Here, the refraction index difference $\Delta n$ in Formula (8) is given by a difference between nb, the refraction index of the optical material forming the second fly's eye member 8b and nc, a refraction index of a medium forming an atmosphere of the micro fly's eye lens 8 (nb−nc). That is, when the micro fly's eye lens 8 is arranged in the air, the refraction index difference $\Delta n$ is given by (nb−1).

In this embodiment, as described above, nb, the refraction index of the optical material forming the second fly's eye member 8b is set relatively large. Therefore, the refraction index difference $\Delta n$ becomes large, then the absolute value of the parameter $\beta$ is reduced. In result, it is possible to reduce change of the distortion aberration caused by variations of surface shapes of the minute refraction surfaces of the micro fly's eye lens MF, then to reduce effects on the illumination intensity distribution in the mask M and the wafer W based on the foregoing actions of the invention.

Figure 5:
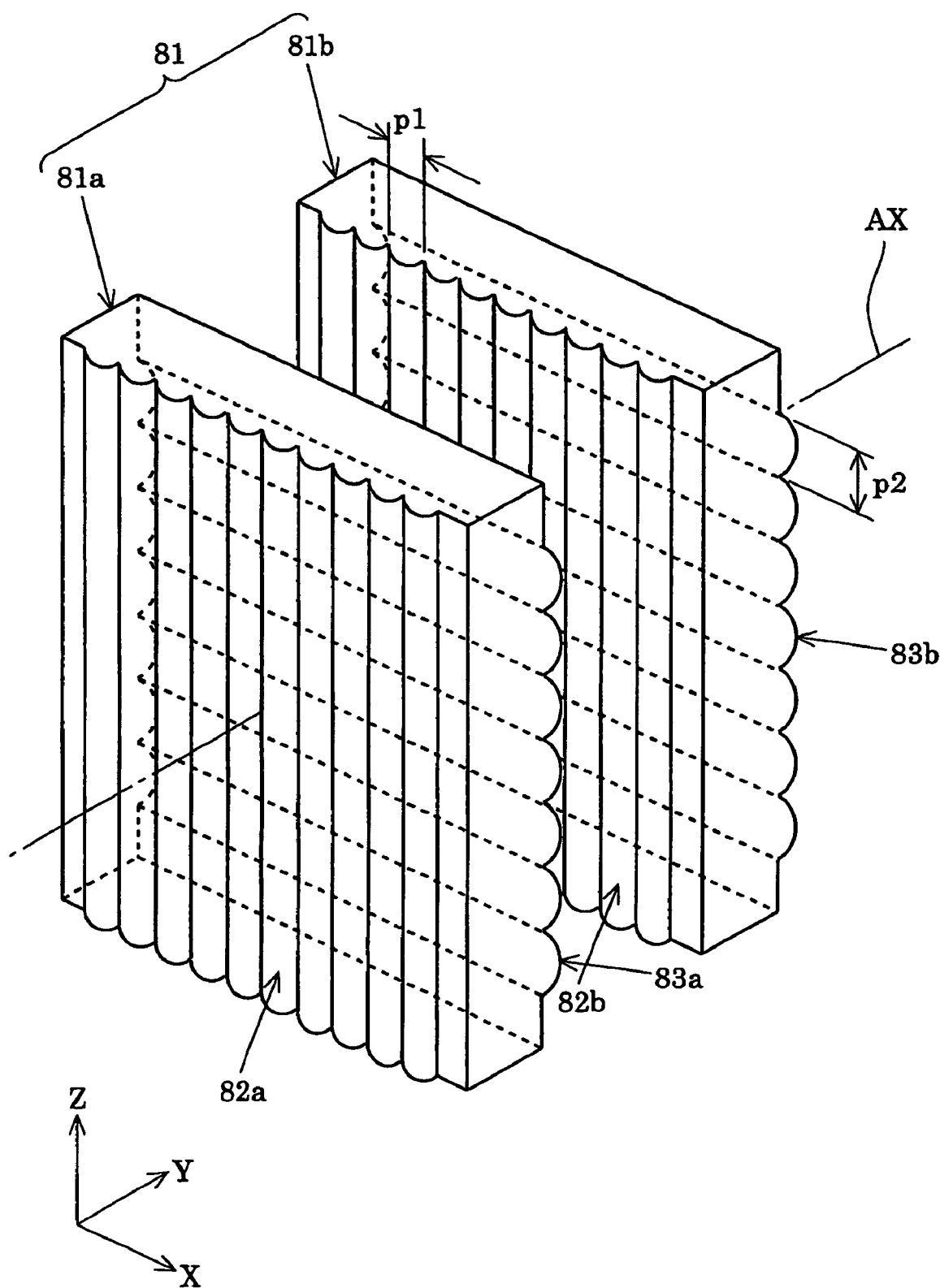
FIG. 5 is a perspective view schematically showing a construction of a cylindrical micro fly's eye lens according to a first modification of the embodiment.

In the foregoing embodiment, the invention is applied to the micro fly's eye lens 8, wherein each minute refraction surface is formed spherically. However, application is not limited thereto. Such a modification (first modification) can be adopted that the invention is applied to a cylindrical micro fly's eye lens, wherein each minute refraction surface is formed cylindrically. FIG. 5 is a perspective view schematically showing a construction of the cylindrical micro fly's eye lens according to the first modification of the embodiment.

Referring to FIG. 5, a cylindrical micro fly's eye lens 81 according to the first modification of the embodiment is constructed from a first fly's eye member 81a arranged on the light source side and a second fly's eye member 81b arranged on the mask side. Cylindrical lens groups 82a and 82b arranged along the X direction are formed with a pitch of p1 respectively on each light source side of the first fly's eye member 81a and the second fly's eye member 81b.

Meanwhile, cylindrical lens groups 83a and 83b arranged along the Z direction are formed with a pitch of p2 respectively on each mask side of the first fly's eye member 81a and the second fly's eye member 81b. Focusing attention on refraction action in terms of the X direction of the cylindrical micro fly's eye lens 81 (that is, refraction action in terms of the XY plane), a wavefront of a parallel light beam entering along the optical axis AX is segmentalized with the pitch of p1 along the X direction by the cylindrical lens group 82a formed on the light source side of the first fly's eye member 81a. Then, the light beam receives condensing action on the refraction surface thereof. After that, the light beam receives condensing action on a refraction surface of a corresponding cylindrical lens among the cylindrical lens group 82b formed on the light source side of the second fly's eye member 81b. Then, the light beam focuses on the rear side focal surface of the cylindrical micro fly's eye lens 81.

Meanwhile, focusing attention on refraction action in terms of the Z direction of the cylindrical micro fly's eye lens 81 (that is, refraction action in terms of the ZY plane), a wavefront of a parallel light beam entering along the optical axis AX is segmentalized with a pitch of p2 along the Z direction by the cylindrical lens group 83a formed on the mask side of the first fly's eye member 81a. Then the light beam receives condensing action on the refraction surface thereof. After that, the light beam receives condensing action on a refraction surface of a corresponding cylindrical lens among the cylindrical lens group 83b formed on the mask side of the second fly's eye member 81b. Then, the light beam focuses on the rear side focal surface of the cylindrical micro fly's eye lens 81.

As described above, the cylindrical micro fly's eye lens 81 of the first modification is constructed from the first fly's eye member 81a and the second fly's eye member 81b, wherein each cylindrical lens group is arranged on the both sides. However, the cylindrical micro fly's eye lens 81 demonstrates an optical function similar to of the micro fly's eye lens 8 constructed from the first fly's eye member 8a and the second fly's eye member 8b, wherein many minute refraction surfaces having the size of p1 in the X direction and the size of p2 in the Z direction are vertically and horizontally and integrally formed.

When the invention is applied to the cylindrical micro fly's eye lens 81 of the first modification, focusing on the refraction action in terms of the X direction, the refraction surfaces of the cylindrical lens group 82a formed on the light source side of the first fly's eye member 81a construct the first minute refraction surfaces, and the refraction surfaces of the cylindrical lens group 82b formed on the light source side of the second fly's eye member 81b construct the second minute refraction surfaces. Further, focusing on the refraction action in terms of the Z direction, the refraction surfaces of the cylindrical lens group 83a formed on the mask side of the first fly's eye member 81a construct the first minute refraction surfaces, and the refraction surfaces of the cylindrical lens group 83b formed on the mask side of the second fly's eye member 81b construct the second minute refraction surfaces.

In the first modification, nb, the refraction index of the optical material forming the second fly's eye member 81b is set larger than na, the refraction index of the optical material forming the first fly's eye member 81a, and the absolute value of the parameter β is set lower than 0.2. Thereby, similarly to in the foregoing embodiment, in the first modification, change of the distortion aberration caused by variations of surface shapes of the minute refraction surfaces of the cylindrical micro fly's eye lens 81 can be reduced, and effects on the illumination intensity distribution can be reduced.

Figure 6:
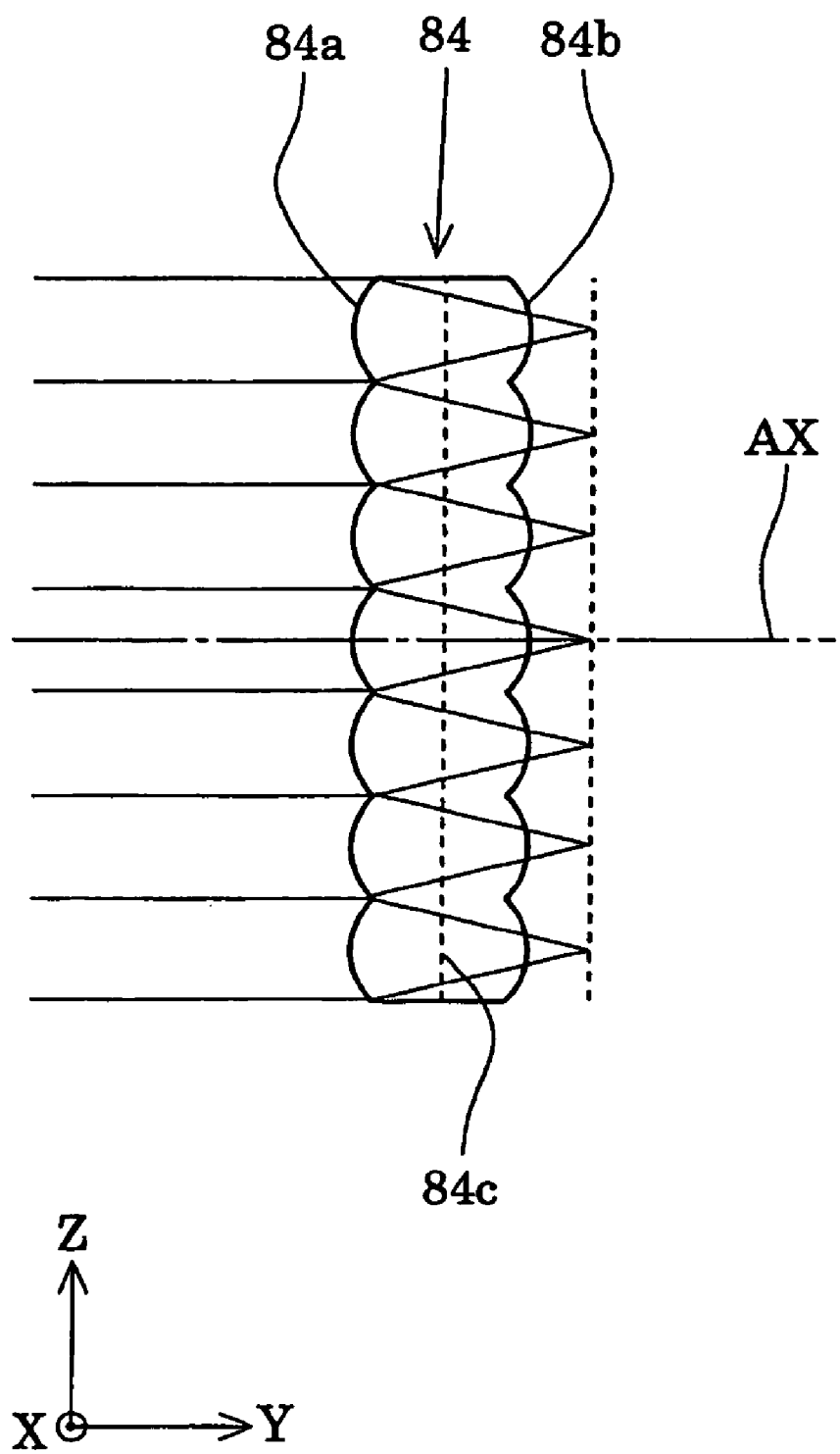
FIG. 6 is a view schematically showing a construction of a micro fly's eye lens according to a second modification of the embodiment.

Further, in the foregoing embodiment, the invention is applied to the micro fly's eye lens 8 constructed from the pair of fly's eye members 8a and 8b. However, application is not limited thereto. It is possible to adopt a modification (second modification), wherein the invention is applied to an ordinary micro fly's eye lens constructed from a single optical member. FIG. 6 is a view schematically showing a construction of the micro fly's eye lens according to the second modification of this embodiment.

In an ordinary micro fly's eye lens 84 constructed from a single optical member as shown in FIG. 6, many first minute refraction surfaces 84a are formed vertically and horizontally and integrally on the light source side thereof, and many second minute refraction surfaces 84b are formed vertically and horizontally and integrally on the mask side thereof so that many second minute refraction surfaces 84b optically correspond to many first minute refraction surfaces 84a. When the invention is applied to the micro fly's eye lens 84 of the second modification, the micro fly's eye lens 84 is bisected by a virtual segmentation surface 84c perpendicular to the optical axis AX. Then, it is regarded that a portion on the light source side from the segmentation surface 84c constructs the first optical member, and a portion on the mask side from the segmentation surface 84c constructs the second optical member.

In the second modification, the micro fly's eye lens 84 is constructed from the single optical member. Therefore, differently from the foregoing embodiment, it is not possible to set a refraction index of an optical material forming the second optical member larger than a refraction index of an optical material forming the first optical member. However, similarly to in the foregoing embodiment, in the second modification, change of the distortion aberration caused by variations of surface shapes of the minute refraction surfaces of the micro fly's eye lens 84 can be reduced, and effects on the illumination intensity distribution can be reduced by setting the absolute value of the parameter β lower than 0.2.

In the case of a scanning exposure type exposure apparatus, illumination intensity nonuniformity in the scanning direction on the wafer W can be reduced by averaging effects by scanning exposure. Therefore, in the micro fly's eye lens (8, 81, and 84) used for the scanning exposure type exposure apparatus, it is not necessary to satisfy the conditional formula of the parameter β in terms of the direction (X direction) optically corresponding to the scanning direction (X direction) on the wafer W. However, it is necessary to satisfy the conditional formula of the parameter β in terms of the direction (Z direction) optically corresponding to the nonscanning direction (Y direction) on the wafer W.

However, it is general that in the micro fly's eye lens (8 and 84), wherein each minute refraction surface is formed spherically, the refracting power ratio γ and the refraction index difference Δn do not depend on the directions but are constant, and the numerical aperture NA on the emission side in the nonscanning direction (Z direction) is set larger than in the scanning direction (X direction). Therefore, when setting is made so that the conditional formula of the parameter β is satisfied in terms of the nonscanning direction (Z direction) according to the invention, the conditional formula of the parameter β in terms of the scanning direction (X direction) is consequentially satisfied as well.

Meanwhile, in the cylindrical micro fly's eye lens 81, wherein each minute refraction surface is formed cylindrically, it is general that the refraction index difference Δn does not depend on the directions but is constant, and the numerical aperture NA on the emission side in the nonscanning direction is set larger than in the scanning direction. However, the refracting power ratio γ does not depend directions, and can be set freely to some extent. Therefore, in this case, such an aspect can be adopted that the conditional formula of the parameter β is satisfied in terms of the nonscanning direction (Z direction), but the conditional formula of the parameter β in terms of the scanning direction (X direction) is not always satisfied.

In the exposure apparatus in the foregoing embodiment (including the modifications), a micro device (semiconductor device, image pickup device, liquid crystal display device, thin film magnetic head and the like) can be manufactured by illuminating the mask (reticle) by the illumination optical device (illumination step), and exposing the pattern for transfer formed on the mask on the photosensitive substrate by using the projection optical system (exposure step). Descriptions will be hereinafter given of an example of a technique in obtaining a semiconductor device as a micro device by forming a given circuit pattern on a wafer or the like as a photosensitive substrate by using the exposure apparatus of the foregoing embodiment with reference to the flowchart of FIG. 7.

Figure 7:
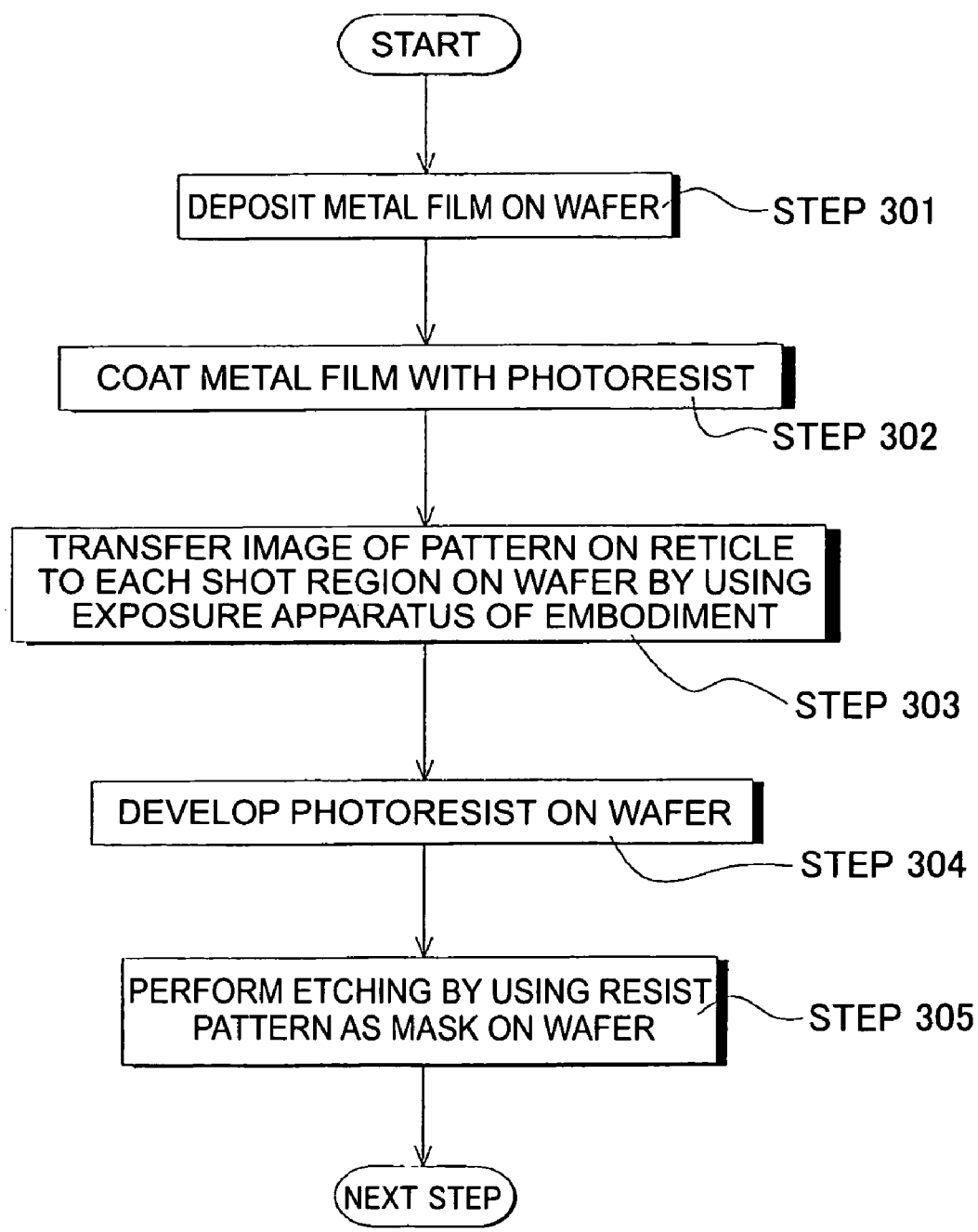
FIG. 7 is a flowchart of a technique in obtaining a semiconductor device as a micro device.

First, in Step 301 of FIG. 7, a metal film is deposited on one lot of wafer. In the next Step 302, the metal film on the one lot of wafer is coated with photoresist. After that, in Step 303, an image of a pattern on the mask is sequentially exposed and transferred in each shot region on the one lot of wafer through the projection optical system by using the exposure apparatus of the foregoing embodiment. After that, in Step 304, the photoresist on the one lot of wafer is developed. Then, in Step 305, etching is performed by using the resist pattern as a mask on the one lot of wafer. Thereby, a circuit pattern corresponding to the pattern on the mask is formed in each shot region on each wafer. After that, for example, a circuit pattern of an upper layer is further formed, and thereby the device such as the semiconductor device is manufactured. According to the foregoing method of manufacturing semiconductor devices, it is possible to obtain a semiconductor device having a very fine circuit pattern with good throughput.

Figure 8:
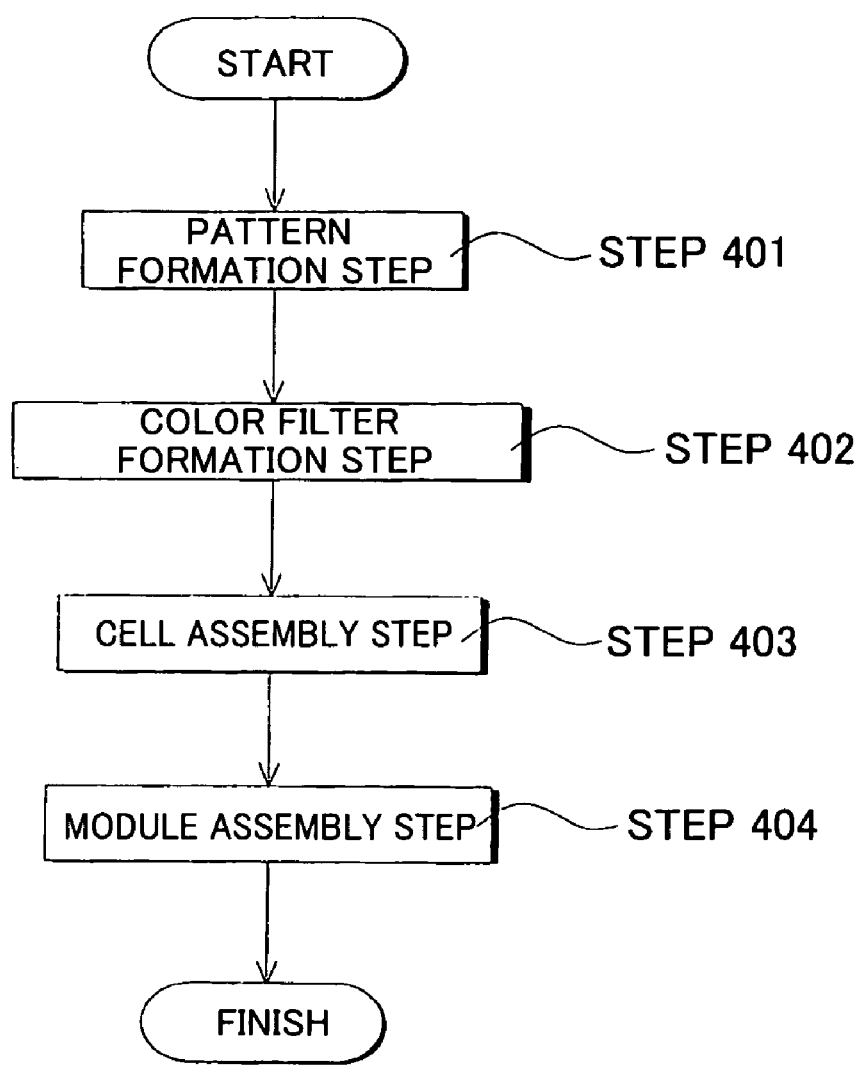
FIG. 8 is a flowchart of a technique in obtaining a liquid crystal display device as a micro device.

Further, in the exposure apparatus of the foregoing embodiment, a liquid crystal display device as a micro device can be also obtained by forming a given pattern (circuit pattern, electrode pattern and the like) on a plate (glass substrate). Descriptions will be hereinafter given of an example of a technique used then with reference to the flowchart of FIG. 8. In FIG. 8, in pattern formation step 401, so-called photolithography step, wherein a pattern of a mask is transferred and exposed on a photosensitive substrate (glass substrate or the like coated with resist) by using the exposure apparatus of the foregoing embodiment is performed. By this photolithography step, a given pattern including many electrodes and the like is formed on the photosensitive substrate. After that, the exposed substrate is provided with respective steps such as development step, etching step, and resist exfoliation step. Thereby, a given pattern is formed on the substrate. The procedure is forwarded to the next color filter formation step 402.

Next, in the color filter formation step 402, a color filter wherein many groups constructed from three dots corresponding to R (Red), G (Green), and B (Blue) are arranged in a state of a matrix, or a color filter wherein a plurality of filter groups constructed from three stripes of R, G, and B are arranged in the direction of horizontal scanning line is formed. Then, after the color filter formation step 402, cell assembly step 403 is performed. In the cell assembly step 403, a liquid crystal panel (liquid crystal cell) is assembled by using the substrate having the given pattern obtained in the pattern formation step 401, the color filter obtained in the color filter formation step 402 and the like. In the cell assembly step 403, the liquid crystal panel (liquid crystal cell) is manufactured by, for example, injecting liquid crystal between the substrate having the given pattern obtained in the pattern formation step 401 and the color filter obtained in the color filter formation step 402.

After that, in module assembly step 404, respective parts such as an electric circuit for making display operation of the assembled liquid crystal panel (liquid crystal cell) and a backlight are installed to complete the liquid crystal display device. According to the foregoing method of manufacturing liquid crystal display devices, it is possible to obtain a liquid crystal display device having a very fine circuit pattern with good throughput.

In the foregoing embodiment, the mask M is illuminated in a state of superimposition by condensing light from the secondary light source by the condenser optical system 9. However, the invention is not limited thereto. It is possible that an illumination field stop (mask blind) and a relay optical system for forming an image of this illumination field stop on the mask M are arranged in the optical path between the condenser optical system 9 and the mask M. In this case, the condenser optical system 9 condenses light from the secondary light source for illuminating the illumination field stop in a state of superimposition. The relay optical system forms the image of an aperture part (light transmittance part) of the illumination field stop on the mask M.

Further, in the foregoing embodiment, the KrF excimer laser light (wavelength: 248 nm) or the ArF excimer laser light (wavelength: 193 nm) is used as exposure light. However, the invention is not limited thereto. The invention can be also applied to, for example, exposure light having a wavelength of 300 nm or less. Further, in the foregoing embodiment, the invention has been described taking the example of the projection exposure apparatus comprising the illumination optical device. However, it is clear that the invention can be applied to a general illumination optical device for illuminating irradiated surfaces other than the mask.

INDUSTRIAL APPLICABILITY

As described above, in the invention, an optical integrator is set to satisfy a conditional formula in terms of a parameter $\beta$. Therefore, change of a distortion aberration caused by variations of surface shapes of minute refraction surfaces of the optical integrator can be reduced, and then effects on an illumination intensity distribution on an irradiated surface can be reduced.

Therefore, in an illumination optical device of the invention, it is possible to illuminate the irradiated surface under desired illumination conditions by using the optical integrator, wherein effects of manufacturing errors of the minute refraction surfaces on the illumination intensity distribution are reduced. Further, in an exposure apparatus and an exposure method of the invention, a good device can be manufactured by performing good projection exposure under good illumination conditions by using the highly efficient illumination optical device capable of illuminating the irradiated surface under the desired illumination conditions.

The invention claimed is:

1. An optical integrator, comprising:

an integrally formed plurality of first minute refraction surfaces; and an integrally formed plurality of second minute refraction surfaces, which are provided closer to a light emission side than the plurality of first minute refraction surfaces so that the plurality of second minute refraction surfaces optically correspond to the plurality of first minute refraction surfaces, wherein a parameter $\beta$ satisfies the following conditions:

$|\beta| < 0.2$ (where $\beta = (\gamma-1)^3 \cdot NA^2/\Delta n^2$), where a refracting power ratio $\phi a/\phi b$ between $\phi a$, a refracting power of the first minute refraction surfaces and $\phi b$, a refracting power of the second minute refraction surfaces is $\gamma$, numerical aperture on the emission side of the optical integrator is NA, and a difference between a refraction index of a medium on a light entrance side of the second minute refraction surfaces and a refraction index of a medium on a light emission side of the second minute refraction surfaces is $\Delta n$.

2. The optical integrator according to claim 1, wherein the plurality of first minute refraction surfaces and the plurality of second minute refraction surfaces are formed on the same optical member.

3. The optical integrator according to claim 2, wherein the plurality of second minute refraction surfaces comprise aspherical surfaces.

4. The optical integrator according to claim 1, comprising:
a first optical member having the plurality of first minute refraction surfaces; and
a second optical member having the plurality of second minute refraction surfaces arranged on a light emission side of the first optical member.

5. The optical integrator according to claim 4, wherein the plurality of second minute refraction surfaces comprise aspherical surfaces.

6. The optical integrator according to claim 1, wherein each minute refraction surface is formed spherically or aspherically.

7. The optical integrator according to claim 6, wherein the aspherical surface is a rotational symmetry aspherical surface or a rotational asymmetry aspherical surface.

8. The optical integrator according to claim 1, which is used for an exposure apparatus, wherein a mask and a photosensitive substrate are relatively moved in relation to the projection optical system along a scanning direction, and thereby a pattern of the mask is projected and exposed on the photosensitive substrate, wherein
an absolute value of the parameter $\beta$ in terms of a direction optically approximately perpendicular to the scanning direction is set lower than an absolute value of the parameter $\beta$ in terms of the scanning direction.

9. An illumination optical device for illuminating an irradiated surface, comprising:
the optical integrator according to claim 1.

10. The illumination optical device according to claim 9, wherein the optical integrator forms a light intensity distribution in a given shape in an illumination region.

11. An exposure apparatus, comprising:
the illumination optical device according to claim 9; and
a projection optical system for projecting and exposing a pattern of a mask arranged on the irradiated surface on a photosensitive substrate.

12. The exposure apparatus according to claim 11, wherein
the pattern of the mask is projected and exposed on the photosensitive substrate by relatively moving the mask and the photosensitive substrate in relation to the projection optical system along a scanning direction, and wherein
an absolute value of the parameter $\beta$ in terms of a direction optically approximately perpendicular to the scanning direction is set lower than an absolute value of the parameter $\beta$ in terms of the scanning direction.

13. An exposure method, comprising the steps of:
illuminating a mask through the illumination optical device according to claim 9, and
projecting and exposing an image of a pattern formed on the illuminated mask on a photosensitive substrate.

14. The exposure method according to claim 13, wherein the step of projecting and exposing an image of a pattern formed on the illuminated mask on a photosensitive substrate comprises the step of projecting and exposing the pattern of the mask on the photosensitive substrate while relatively moving the mask and the photosensitive substrate in relation to the projection optical system along a scanning direction, and wherein
an absolute value of the parameter $\beta$ in terms of a direction optically approximately perpendicular to the scanning direction is set lower than an absolute value of the parameter $\beta$ in terms of the scanning direction.

15. A device manufacturing method comprising:
exposing a photosensitive substrate with the exposure method according to claim 13; and
developing the photosensitive substrate.

16. An optical integrator, comprising, in the following order from a light entrance side:
a first optical member having an integrally formed plurality of first minute refraction surfaces; and
a second optical member having an integrally formed plurality of second minute refraction surfaces, which are provided to optically correspond to the plurality of first minute refraction surfaces,
wherein the first optical member and the second optical member are separated by a space, that is filled with a gas,
wherein a refraction index of an optical material forming the second optical member is set larger than a refraction index of an optical material forming the first optical member,
wherein the optical integrator is used for light having a wavelength of 300 nm or less,
wherein the optical material forming the first optical member includes fluorite, and
wherein the optical material forming the second optical member includes silica glass.

17. The optical integrator according to claim 16, satisfying the following condition:

$0.05 \leq nb-na$, where the refraction index of the optical material forming the first optical member is na, and the refraction index of the optical material forming the second optical member is nb.

18. The optical integrator according to claim 16, wherein each minute refraction surface is formed spherically or aspherically.

19. The optical integrator according to claim 18, wherein the aspherical surface is a rotational symmetry aspherical surface or a rotational asymmetry aspherical surface.

20. The optical integrator according to claim 16, which is used for an exposure apparatus, wherein a mask and a photosensitive substrate are relatively moved in relation to the projection optical system along a scanning direction, and thereby a pattern of the mask is projected and exposed on the photosensitive substrate,
wherein a parameter $\beta$ satisfies the following conditions:

$|\beta|<0.2$ (where $\beta=(\gamma-1)^3 \cdot NA^2/\Delta n^2$), where a refracting power ratio $\phi a/\phi b$ between $\phi a$, a refracting power of the first minute refraction surfaces and $\phi b$, a refracting power of the second minute refraction surfaces is $\gamma$, a numerical aperture on the emission side of the optical integrator is NA, and a difference between a refraction index of a medium on a light entrance side of the second minute refraction surfaces and a refraction index of a medium on a light emission side of the second minute refraction surfaces is $\Delta n$, and
wherein an absolute value of the parameter $\beta$ in terms of a direction optically approximately perpendicular to the scanning direction is set lower than an absolute value of the parameter $\beta$ in terms of the scanning direction.

21. An illumination optical device for illuminating irradiated surface, comprising:
the optical integrator according to claim 16.

22. The illumination optical device according to claim 21, wherein the optical integrator forms a light intensity distribution in a given shape in an illumination region.

23. An exposure apparatus, comprising:
the illumination optical device according to claim 21; and
a projection optical system for projecting and exposing a pattern of a mask arranged on the irradiated surface on a photosensitive substrate.

24. The exposure apparatus according to claim 23, wherein
the pattern of the mask is projected and exposed on the photosensitive substrate by relatively moving the mask and the photosensitive substrate in relation to the projection optical system along a scanning direction,
wherein a parameter $\beta$ satisfies the following conditions:

$|\beta|<0.2$ (where $\beta=(\gamma-1)^3 \cdot NA^2/\Delta n^2$), where a refracting power ratio $\phi a/\phi b$ between $\phi a$, a refracting power of the first minute refraction surfaces and $\phi b$, a refracting power of the second minute refraction surfaces is $\gamma$, a numerical aperture on the emission side of the optical integrator is NA, and a difference between a refraction index of a medium on a light entrance side of the second minute refraction surfaces and a refraction index of a medium on a light emission side of the second minute refraction surfaces is $\Delta n$, and
wherein an absolute value of the parameter $\beta$ in terms of a direction optically approximately perpendicular to the scanning direction is set lower than an absolute value of the parameter $\beta$ in terms of the scanning direction.

25. An exposure method, comprising the steps of:
illuminating a mask through the illumination optical device according to claim 21, and
projecting and exposing an image of a pattern formed on the illuminated mask on a photosensitive substrate.

26. The exposure method according to claim 25, wherein
the step of projecting and exposing an image of a pattern formed on the illuminated mask on a photosensitive substrate comprises the step of projecting and exposing the pattern of the mask on the photosensitive substrate while relatively moving the mask and the photosensitive substrate in relation to the projection optical system along a scanning direction, wherein
a parameter $\beta$ satisfies the following conditions:

$|\beta|<0.2$ (where $\beta=(\gamma-1)^3 \cdot NA^2/\Delta n^2$), where a refracting power ratio $\phi a/\phi b$ between $\phi a$, a refracting power of the first minute refraction surfaces and $\phi b$, a refracting power of the second minute refraction surfaces is $\gamma$, a numerical aperture on the emission side of the optical integrator is NA, and a difference between a refraction index of a medium on a light entrance side of the second minute refraction surfaces and a refraction index of a medium on a light emission side of the second minute refraction surfaces is $\Delta n$, and
wherein an absolute value of the parameter $\beta$ in terms of a direction optically approximately perpendicular to the scanning direction is set lower than an absolute value of the parameter $\beta$ in terms of the scanning direction.

27. An exposure apparatus, comprising:
an illumination optical system including an optical integrator; and
a projection optical system for forming a pattern image of a mask on a photosensitive substrate, wherein
the pattern of the mask is projected and exposed on the photosensitive substrate while the mask and the photosensitive substrate are relatively moved in relation to the projection optical system along a scanning direction, wherein
the optical integrator comprises: an integrally formed plurality of first minute refraction surfaces; and an integrally formed plurality of second minute refraction surfaces, which are provided closer to a light emission side than the plurality of first minute refraction surfaces so that the plurality of second minute refraction surfaces optically correspond to the plurality of first minute refraction surfaces, and wherein
a parameter $\beta$ satisfies the following conditions:

$|\beta|<0.2$ (where $\beta=(\gamma-1)^3 \cdot NA^2/\Delta n^2$), where a refracting power ratio $\phi a/\phi b$ between $\phi a$, a refracting power of the first minute refraction surfaces in terms of a non-scanning direction optically approximately perpendicular to the scanning direction and $\phi b$, a refracting power of the second minute refraction surfaces in terms of the non-scanning direction is $\gamma$, numerical aperture on the emission side in terms of the non-scanning direction of the optical integrator is NA, and a difference between a refraction index of a medium on a light entrance side of the second minute refraction surfaces and a refraction index of a medium on a light emission side of the second minute refraction surfaces is $\Delta n$.

28. An exposure method, comprising the steps of:
illuminating a mask through the illumination optical device including an optical integrator, and
projecting and exposing an image of a pattern formed on the illuminated mask on a photosensitive substrate, wherein
the step of projecting and exposing an image of a pattern formed on the illuminated mask on a photosensitive substrate comprises the step of projecting and exposing the pattern of the mask on the photosensitive substrate while relatively moving the mask and the photosensitive substrate in relation to the projection optical system along a scanning direction, wherein
the optical integrator comprises: an integrally formed plurality of first minute refraction surfaces; and an integrally formed plurality of second minute refraction surfaces, which are provided closer to a light emission side than the plurality of first minute refraction surfaces so that the plurality of second minute refraction surfaces optically correspond to the plurality of first minute refraction surfaces, and wherein
a parameter $\beta$ satisfies the following conditions:

$|\beta|<0.2$ (where $\beta=(\gamma-1)^3 \cdot NA^2/\Delta n^2$), where a refracting power ratio $\phi a/\phi b$ between $\phi a$, a refracting power of the first minute refraction surfaces in terms of a non-scanning direction optically approximately perpendicular to the scanning direction and $\phi b$, a refracting power of the second minute refraction surfaces in terms of the non-scanning direction is $\gamma$, numerical aperture on the emission side in terms of the non-scanning direction of the optical integrator is NA, and a difference between a refraction index of a medium on a light entrance side of the second minute refraction surfaces and a refraction index of a medium on a light emission side of the second minute refraction surfaces is $\Delta n$.

29. A device manufacturing method comprising:
exposing a photosensitive substrate with the exposure method according to claim 28; and
developing the photosensitive substrate.

30. An exposure method comprising:
introducing a radiation from a source to a plurality of first minute refraction surfaces which are integrally formed on a first member of an optical integrator;
introducing a radiation from the first minute refraction surfaces to a plurality of second minute refraction surfaces which are integrally formed on a second member of the optical integrator, and which optically correspond to the plurality of the first minute refraction surfaces;
illuminating a pattern with a radiation from the optical integrator; and
projecting a pattern image on a photosensitive substrate while moving the photosensitive substrate along a scanning direction,
wherein a parameter β satisfies the following conditions:

$|\beta|<0.2$ (where $\beta=(\gamma-1)^3 \cdot NA^2/\Delta n^2$), where a refracting power ratio φa/φb between φa, a refracting power of the first minute refraction surfaces in terms of a non-scanning direction optically approximately perpendicular to the scanning direction and φb, a refracting power of the second minute refraction surfaces in terms of the non-scanning direction is γ, a numerical aperture on the emission side in terms of the non-scanning direction of the optical integrator is NA, and a difference between a refraction index of a medium on a light entrance side of the second minute refraction surfaces and a refraction index of a medium on a light emission side of the second minute refraction surfaces is Δn.

31. A device manufacturing method comprising:
exposing a photosensitive substrate with the exposure method according to claim 30; and
developing the photosensitive substrate.

32. An exposure method comprising:
introducing a radiation from a source to a plurality of first minute refraction surfaces which are integrally formed on a first optical member of an optical integrator;
introducing a radiation from the first minute refraction surfaces to a plurality of second minute refraction surfaces which are integrally formed on a second optical member of the optical integrator, and which optically correspond to the plurality of first minute refraction surfaces;
illuminating a pattern with a radiation from the optical integrator; and
projecting a pattern image on a photosensitive substrate while moving the photosensitive substrate along a scanning direction,
wherein the first optical member and the second optical member are separated by a space, that is filled with a gas,
wherein a refraction index of an optical material forming the second optical member is set larger than a refraction index of an optical material forming the first optical member,
wherein the radiation from the source includes light having a wavelength of 300 nm or less,
wherein the optical material forming the first optical member includes fluorite, and
wherein the optical material forming the second optical member includes silica glass.

33. A device manufacturing method comprising:
exposing a photosensitive substrate with the exposure method according to claim 32; and
developing the photosensitive substrate.

34. A method of manufacturing an optical integrator comprising:
integrally forming a plurality of first minute refraction surfaces on the optical integrator; and
integrally forming a plurality of second minute refraction surfaces on the optical integrator, the second minute refraction surfaces optically corresponding to the plurality of first minute refraction surfaces,
wherein a parameter β satisfies the following conditions:

$|\beta|<0.2$ (where $\beta=(\gamma-1)^3 \cdot NA^2/\Delta n^2$), where a refracting power ratio φa/φb between φa, a refracting power of the first minute refraction surfaces in terms of a non-scanning direction optically approximately perpendicular to the scanning direction and φb, a refracting power of the second minute refraction surfaces in terms of the non-scanning direction is γ, a numerical aperture on the emission side in terms of the non-scanning direction of the optical integrator is NA, and a difference between a refraction index of a medium on a light entrance side of the second minute refraction surfaces and a refraction index of a medium on a light emission side of the second minute refraction surfaces is Δn.

35. The method according to claim 34, wherein the plurality of first minute refraction surfaces are formed on a first member of the optical integrator, and wherein the plurality of first minute refraction surfaces are formed on a second member of the optical integrator.

36. The method according to claim 35, further comprising:
arranging the first member and the second member separately from each other.

37. An optical integrator manufactured by the method according to claim 34.

38. A method of manufacturing an optical integrator comprising:
integrally forming a plurality of first minute refraction surfaces on a first optical member of the optical integrator;
integrally forming a plurality of second minute refraction surfaces on a second optical member of the optical integrator, the second minute refraction surfaces optically corresponding to the plurality of first minute refraction surfaces; and
arranging the first optical member and the second optical member separately from each other, with a gas-filled space between the first and second optical members,
wherein a refraction index of an optical material forming the second optical member is set larger than a refraction index of an optical material forming the first optical member,
wherein the optical integrator is used for light including a wavelength of 300 nm or less,
wherein the optical material forming the first optical member includes fluorite, and
wherein the optical material forming the second optical member includes silica glass.

* * * * *